Figure 1:
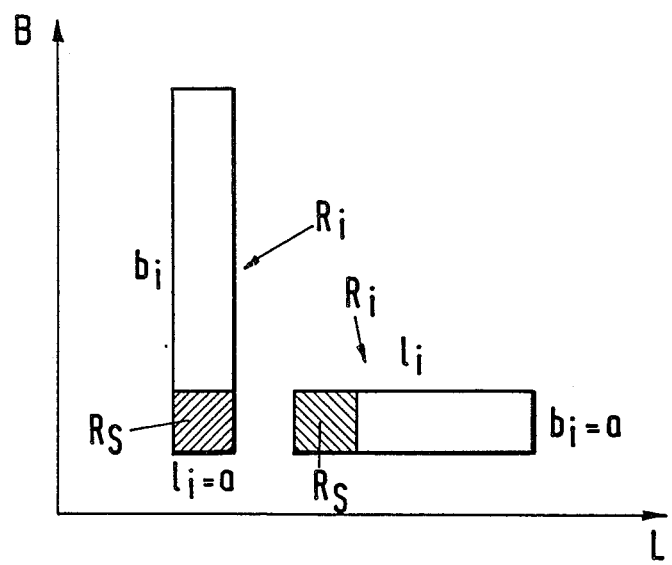

United States Patent [19]

Rösner

[11] Patent Number: 4,772,867
[45] Date of Patent: Sep. 20, 1988

[54] PRECISION RESISTANCE NETWORK, ESPECIALLY FOR THICK-FILM HYBRID CIRCUITS

[75] Inventor: Bela Rösner, Lüdenscheid, Fed. Rep. of Germany

[73] Assignee: Brown, Boveri & Cie AG, Mannheim, Fed. Rep. of Germany

[21] Appl. No.: 85,472

[22] Filed: Aug. 13, 1987

[30] Foreign Application Priority Data

Aug. 14, 1986 [DE] Fed. Rep. of Germany ....... 3627682

[51] Int. Cl.$^4$ ............................................ H01C 1/012
[52] U.S. Cl. .................................. 338/308; 338/306; 427/101
[58] Field of Search .............. 338/306, 307, 308, 309; 252/514–519; 427/101, 102, 103; 29/620

[56] References Cited

U.S. PATENT DOCUMENTS

| | | | |
|---|---|---|---|
| 4,139,832 | 2/1979 | Yoshino et al. | 338/308 |
| 4,186,367 | 1/1980 | Chakrabarty et al. | 338/21 |
| 4,284,970 | 8/1981 | Berrin et al. | 338/195 |
| 4,312,770 | 1/1982 | Yu et al. | 252/514 |
| 4,320,165 | 3/1982 | Cash | 428/213 |
| 4,362,656 | 12/1982 | Hormadaly | 252/518 |
| 4,548,742 | 10/1985 | Hormadaly | 252/519 |
| 4,630,025 | 12/1986 | Bourolleau | 338/309 |

Primary Examiner—E. A. Goldberg
Assistant Examiner—M. M. Latef
Attorney, Agent, or Firm—Herbert L. Lerner; Laurence A. Greenberg

[57] ABSTRACT

A precision resistance network of individual resistances $R_i$, especially for thick-film hybrid circuits includes an integrated structure formed of an electrically insulated substrate, having an electrically conductive film of constant thickness d applied thereto, the electrically conducted layer having a surface resistance ($R_S$) exclusively dimensioned as a function of the individual resistances ($R_i$) in accordance with the equation $$R_S = \sqrt{\frac{\sum_{R_i > R_{S^*}} R_i}{\sum_{R_i \leq R_{S^*}} \frac{1}{R_i}}}$$

wherein $$R_{S^*} = \sqrt{\frac{\sum_{i=1}^{N} R_i}{\sum_{i=1}^{N} \frac{1}{R_i}}}$$

3 Claims, 1 Drawing Sheet

PRECISION RESISTANCE NETWORK, ESPECIALLY FOR THICK-FILM HYBRID CIRCUITS

The invention relates to a precision resistance network, especially for thick-film hybrid circuits, which is formed and integrated by applying an electrically conductive film of constant thickness to an electrically insulated substrate.

Resistance networks produced by thick-film technology have heretofore been used primarily in consumer electronics and computer industries as noted, for example, by W. Funk in Philips Technische Rundschau (Philips Technical Review) 35, 165 ff, 1975/1976). Following the introduction of new resistance pastes in the 1970s, very stable, laser-balanced thick-film resistors of high accuracy can now be produced, such as $\Delta R/R < 0.3\%$ after 100,000 hours in operation; $T_K < 50$ ppm/$_K$; $T_K$ synchronization $< 25$ ppm/$_K$; as noted, for example, by R. Tschernev in Markt & Technik (Market and Technology) 21, 84—1984.

These properties of thick-film resistors permit them to be used both in medical, military and space technology and in measuring technology, for example, as a voltage-divider resistance network such as is noted, for example, by R. E. Cote and R. C. Headley in Electronics Packaging and Production, No. 11 (1977).

Such resistance networks, respectively, are known to be produced from only one particular resistance paste, which generally has one uniformly set value for so-called surface resistance $R_S$ for all conceivable resistance combinations, this value then being located somewhere between the lowest and the highest value of the individual resistances of the particular network, in order to assure defined temperature synchronization and aging properties.

It has not been known, however, in the prior art to adapt the surface resistance of the resistance paste used to the predetermined individual resistances of the individually required resistance network by mixing the resistance paste in such a way that the surface area requirement of the resistance network is minimized.

It is accordingly an object of the invention in the instant application, in order to produce resistance networks made up of individual resistances and formed by applying an electrically conductive film of constant thickness to an electrically insulated substrate, to apply a rule for dimensioning the value of the surface resistance $R_S$ by the aid of which the total surface area required for the individually required resistance network is minimized and thus its stability can be optimized at the same time.

With the foregoing and other objects in view, there is provided, in accordance with the invention, a precision resistance network of individual resistances $R_i$, especially for thick-film hybrid circuits, comprising an integrated structure formed of an electrically insulated substrate, having an electrically conductive film of constant thickness d applied thereto, the electrically conducted layer having a surface resistance ($R_S$) exclusively dimensioned as a function of the individual resistances ($R_i$) in accordance with the equation:

$$R_S = \sqrt{\frac{\sum\limits_{R_i > R_S^*} R_i}{\sum\limits_{R_i \leq R_S^*} \frac{1}{R_i}}}$$

wherein $$R_S^* = \sqrt{\frac{\sum\limits_{i=1}^{N} R_i}{\sum\limits_{i=1}^{N} \frac{1}{R_i}}}$$

It is advantageous that not only the total surface area required but also the mass of the film of constant thickness d, preferably a resistance paste to be applied by screen printing, is also minimized, which means a savings in cost. Also, the resistance networks can be further miniaturized. Additionally, the total length of all the laser cuts required, by the aid of which the resistor network is balanced in a conventional manner, is minimal. Not only does this reduction improve the quality of the laser cuts, that is, especially the curve form seen under the scanning electron microscope, but this reduction of the total laser cut length which is required also favorably affects the stability, i.e. the respective deviation of the actual resistance from the desired set-point or nominal resistance.

According to the invention, the dimensioning of the surface resistance $R_S$ of a precision resistance network is obtained exclusively as a function of the individual resistors or resistances $R_i$. In the following, the particular optimal surface resistance $R_S$ at which the total surface area required for the network is minimized is to be calculated for a resistance network to be disclosed, which is made up of N individual resistors $R_i$.

As is well known, the characterizing variable for the resistance of conductors of large surface area in integrated circuits (film circuits or hybrid circuits) is known as surface resistance, $R_S$. This is defined as the resistance of a quadratic conductor surface area, having a thickness d and a specific resistance $\rho$, in accordance with:

$$R_S = \frac{\rho}{d} \, [\Omega]. \tag{1}$$

This results from the general equation for the resistance of a conductor:

$$R = \rho \cdot \frac{l}{d \cdot b} \tag{2}$$

if the value for the length l is inserted for the width b. The surface resistance $R_S$ proves to be more suitable, when describing the properties of electrically conductive film circuits, than the specific resistance $\rho$.

From (1) and (2), the following is obtained:

$$R = R_S \cdot \frac{l}{b}. \tag{3}$$

From this, it is apparent that the resistance of an individual resistor $R_i$ is formed from the product of a material factor (surface resistance $R_S$) and a geometry factor (length-width quotient $l_i/b_i$, the so-called aspect ratio).

Features which are considered as characteristic for the invention are set forth in the appended claims.

Although the invention is illustrated and described herein as embodied in a precision resistance network, especially for thick-film hybrid circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a diagrammatic view of two individual resistors or resistances according to the invention.

As FIG. 1, the sole FIGURE of the drawing shows, first two types of individual resistors or resistances $R_i$ must be distinguished; on the one hand, individual resistors $R_i$ in which the particular width $b_i=a$ is always minimal in dimension, and on the other hand, individual resistors $R_i$ in which the length $l_i=a$ is dimensioned minimally. The minimal width $b_i=a$ or the minimal length $l_i=a$ is determined by the limitations of screen printing and by the influence of the resistor-conductor transitions. The minimum dimensions a below which it was previously impossible to go are approximately between 0.8 to 1 mm.

For the N individual resistors $R_i$, the following applies:

$$R_i = R_S \frac{l_i}{b_i} \tag{4}$$

where $b_i=a$ should be true, if $R_i > R_S$, and where $l_i=a$ should apply if $R_i \leq R_S$.

The total surface areas of the resistance network then is generally as follows:

$$f = a \sum_{\substack{l_i > a \\ (b_i=a)}} l_i + a \sum_{\substack{b_i \geq a \\ (l_i=a)}} b_i \tag{5}$$

as well as, by equations (4) and (5), respectively, $$f = f(R_S) = a^2 \sum_{R_i > R_S} \frac{R_i}{R_S} + a^2 \sum_{R_i \leq R_S} \frac{R_S}{R_i} \tag{6}$$

and $$f/a^2(R_S) = \sum_{R_i > R_S} \frac{R_i}{R_S} + \sum_{R_i \leq R_S} \frac{R_S}{R_i} \tag{7}$$

Although this is an exact function of $R_S$, it cannot be calculated explicitly yet, because the summation index of the respective summands remains dependent upon the surface resistance $R_S$, which has yet to be determined.

Therefore, an approximation process is first performed. The summation index of the various summands of equation (7) is applied to all individual resistors or resistances $R_i$, assuming that there will be a given error. This leads to a new function F:

$$F = F(R_S) = \sum_{i=1}^{N} \frac{R_i}{R_S} + \sum_{i=1}^{N} \frac{R_S}{R_i} \tag{8}$$

It is true for the new function that $F(R_S) > f/a^2(R_S)$. Likewise, however, $F(R_S)$ does provide a good approximation of $f/a^2(R_S)$, because the respective sum of N numbers, which are all greater than 1, is changed little by the further addition of N numbers that are all smaller than 1. In other words, $F(R_S)$ differs from $f/a^2(R_S)$ by the amount of those terms that are respectively reliably less than 1.

With the approximation function $F(R_S)$, a function is now available which, although it is not exact, is at least calculable.

By differentiation of this function, $F=F(R_S)$, and nullification of the first derivation $F'(R_S)=0$, the value $R_S^*$, in which F has an extreme value, is obtained.

$$\frac{dF(R_S)}{dR_S} = -\frac{1}{R_S^2} \sum_{i=1}^{N} R_i + \sum_{i=1}^{N} \frac{1}{R_i} = 0 \tag{9}$$

and $$R_S^* = \sqrt{\frac{\sum_{i=1}^{N} R_i}{\sum_{i=1}^{N} \frac{1}{R_i}}} \tag{10}$$

Because $F''(R_S)$ also is at the point where $R_S=R_S^* > 0$, then where $R_S=R_S^*$, a minimum value is present. $R_S^*$ is thus in a first approximation already a good value for the optimal surface resistance sought.

For a predetermined resistance network of N individual resistors or resistances $R_i$, the surface resistance $R_S^*$ can thus be adjusted approximately by mixing a resistance paste in accordance with the above equation.

Repeating the above approximation method now makes it possible to ascertain the exact optimal surface resistance value $\overline{R_S}$.

By inserting $R_S^*$ in equation (7):

$$f/a^2(R_S^*) = \sum_{R_i > R_S^*} \frac{R_i}{R_S^*} + \sum_{R_i \leq R_S^*} \frac{R_S^*}{R_i} \tag{11}$$

By differentiation of this function $f/a^2(R_S)$ and setting the first derivative to zero, the value of the optimal surface resistance sufficiently exact for practical requirements is obtained as follows, because now the summation limits are also known:

$$R_S = \sqrt{\frac{\sum_{R_i > R_S^*} R_i}{\sum_{R_i \leq R_S^*} \frac{1}{R_i}}} \tag{12}$$

In the final analysis, ascertaining the dimensioning rule is an iterative method, with the aid of which the useful exact value in a particular case for the surface resistance is calculated in accordance with practical requirements (at the present time, pastes can be produced with a tolerance of ±10%).

In accordance to the invention, the consumption of paste is minimized and, simultaneously, the stability and precision, respectively, of the resistance network is optimized. If the load-carrying capacity of the resistance network is significant, it can be adjusted with the parameter a for the purpose of enlarging the film cross section through which current flows.

EXAMPLE

A resistance network is to be designed with minimized surface area, wherein:
$R_1=0.5$ k$\Omega$, $R_2=0.5$ k$\Omega$, $R_3=1.5$ k$\Omega$, $R_4=2.5$ k$\Omega$, $R_5=5\Omega$, $R_6=15$ k$\Omega$, $R_7=25$ k$\Omega$, $R_8=50$ k$\Omega$, $R_9=150$ k$\Omega$, $R_{10}=250$ k$\Omega$, $R_{11}=500$ k$\Omega$, $R_{12}=1500$ k$\Omega$.

In accordance with equation (10), in a first approximation the following is obtained:

$$R_S^* = \sqrt{\frac{2500 \, k\Omega}{5.4067 \, (k\Omega)^{-1}}} = 21.50 \, k\Omega$$

In accordance with equation (12), the sufficiently exact value as follows is obtained:

$$R_S = \sqrt{\frac{1500 + 500 + 250 + 150 + 50 + 25 [k\Omega]}{\frac{1}{15} + \frac{1}{5} + \frac{1}{2.5} + \frac{1}{1.5} + \frac{1}{0.5} + \frac{1}{0.5} [(k\Omega)^{-1}]}} = 21.54 \, k\Omega$$

As a sample, a surface area is ascertained in accordance with equation (11) for $a=1$ mm:

$$f(R_S) = 229.78 \, mm^2$$

It can be shown that the surface area requirement for all $\overline{R_S}$ with $|R_S - \overline{R_S}| < \epsilon$, wherin $\epsilon \to 0$ is greater than $f(\overline{R_S})$. Thus, for example, $f(\overline{R_S}=10 \, k\Omega)=302 \, mm^2$, $f(R_s=100 \, k\Omega)=563 \, mm^2$ or $f(R_S=22 \, k\Omega)=229.83 \, mm^2$ and $f(R_S=21 \, k\Omega)=229.85 \, mm^2$.

The geometric dimensions of each individual resistor or resistance $R_i$ that are required for dimensioning the resistance network are obtained in accordance with $R_i = R_S \cdot l_i / b_i$ with reference to the following table and can be set or determined by laser balancing.

| $R_i[\Omega]$ | $\overline{R_S}[\Omega]$ | $b_i[mm]$ | $l_i[mm]$ | |
|---|---|---|---|---|
| 0.5 | 21.54 | 43.08 | a = 1 | |
| 0.5 | 21.54 | 43.08 | a | $f_2 = a \sum_{R_i \leq \overline{R_S}} b_i = 114.89 \, mm^2$ |
| 1.5 | 21.54 | 14.36 | a | |
| 2.5 | 21.54 | 8.62 | a | |
| 5 | 21.54 | 4.31 | a | |

-continued

| $R_i[\Omega]$ | $\overline{R_S}[\Omega]$ | $b_i[mm]$ | $l_i[mm]$ | |
|---|---|---|---|---|
| 15 | 21.54 | 1.44 | a | |
| 25 | 21.54 | a = 1 | 1.16 | $f_1 = a \sum_{R_i > \overline{R_S}} l_i = 114.89 \, mm^2$ |
| 50 | 21.54 | a | 2.32 | |
| 150 | 21.54 | a | 6.96 | |
| 250 | 21.54 | a | 11.60 | |
| 500 | 21.54 | a | 23.21 | |
| 1500 | 21.54 | a | 69.64 | |

The sample in accordance with equation (5) produces the following:

$$f = \sum_{R_i} l_i b_i = f_1 + f_2 = 229.78 \, mm^2$$

The foregoing is a description corresponding in substance to German Application No. P 36 27 682.0, dated Aug. 14, 1986, the International priority of which is being claimed for the instant application, and which is hereby made part of this application. Any material discrepancies between the foregoing specification and the aforementioned corresponding German application are to be resolved in favor of the latter.

I claim:

1. A precision resistance network of individual resistances $R_i$, especially for thick-film hybrid circuits, comprising an integrated structure formed of an electrically insulated substrate, having an electrically conductive film of constant thickness d applied thereto, said electrically conductive film having a surface resistance ($R_S$) exclusively dimensioned as a function of the individual resistances ($R_i$) in accordance with the equation:

$$R_S = \sqrt{\frac{\sum\limits_{R_i > R_S^*} R_i}{\sum\limits_{R_i \leq R_S^*} \frac{1}{R_i}}}$$

wherein $$R_S^* = \sqrt{\frac{\sum\limits_{i=1}^{N} R_i}{\sum\limits_{i=1}^{N} \frac{1}{R_i}}}.$$

2. A precision resistance network according to claim 1, wherein said electrically conductive film is an electrically conductive resistance paste pressed onto the electrically insulating substrate.

3. A precision resistance network according to claim 1 wherein said electrically conductive film is in the form of a network pattern of a fine-screen thick-film conductor track arrangement applied to said electrically insulating substrate.

* * * * *